(12) United States Patent
Shook

(10) Patent No.: US 7,965,139 B1
(45) Date of Patent: Jun. 21, 2011

(54) AMPLIFIER OFFSET AND NOISE REDUCTION IN A MULTISTAGE SYSTEM

(75) Inventor: Adam L. Shook, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/718,134

(22) Filed: Mar. 5, 2010

(51) Int. Cl.
*H03F 3/45* (2006.01)
(52) U.S. Cl. .............................. 330/69; 330/9
(58) Field of Classification Search .............. 330/9, 69, 330/252
See application file for complete search history.

(56) References Cited

U.S. PATENT DOCUMENTS

| | | | |
|---|---|---|---|
| 3,899,743 A | 8/1975 | Csicsatka | |
| 5,257,285 A | 10/1993 | Thorp | |
| 6,031,420 A * | 2/2000 | Vander Voorde | 330/9 |
| 6,262,627 B1 * | 7/2001 | Ghiozzi et al. | 330/51 |
| 6,642,783 B2 | 11/2003 | Constantinidis et al. | |
| 7,019,588 B2 * | 3/2006 | Wouters | 330/69 |
| 7,132,882 B2 | 11/2006 | Chen et al. | |
| 2006/0279344 A1 | 12/2006 | Chen et al. | |

* cited by examiner

*Primary Examiner* — Henry K Choe
(74) *Attorney, Agent, or Firm* — John J. Patti; Wade J. Brady, III; Frederick J. Telecky, Jr.

(57) ABSTRACT

Conventional multistage amplifiers oftentimes employ trim circuits or highly matched components to combat noise and offset contributions. Having trim circuitry or highly matched components increases the overall size, cost, and power consumption, so it is desirable to have a circuit that reduces any need for better matching components or trim circuitry. Here, a multistage amplifier system is provided that generally accounts for some noise and offset contributions, reducing the need for better matching components and/or trim circuitry.

9 Claims, 1 Drawing Sheet

# AMPLIFIER OFFSET AND NOISE REDUCTION IN A MULTISTAGE SYSTEM

TECHNICAL FIELD

The invention relates generally to multistage amplifier system and, more particularly, to multistage amplifier system having reduced noise and offset.

BACKGROUND

Turning to FIG. 1 of the drawings, a conventional two-stage amplifier system 100 can be seen. System 100 generally comprise a first stage 102 and a second stage 104 (which are each generally inverting amplifiers). As can be seen, resistor networks (resistors R1/R1 and resistors R3/R4) are coupled between the negative input terminals and output terminals of operational amplifiers 106 and 108, respectively, so that stage 102 can receive the input signal VIN and that stage 104 can receive output signal VOUT1. Additionally, offset voltage source 110 and 112 provide offset voltages VOS1 and VOS2 to operational amplifiers 106 and 108, respectively. Each of the voltage sources 110 and 112 (which include the internal offsets of amplifiers 106 and 108) are also coupled to supply rail 114 (which is generally at ground).

Because of the configuration of system 100 offset and noise contributions from voltage source 110 can significantly affect the output signal VOUT2. For the amplifier stage 102, output signal VOUT1 can be represented as follows:

$$VOUT1 = \frac{-R2}{R1}(VIN - VOS1) + VOS1 \tag{1}$$

Additional, amplifier stage 104, output signal VOUT2 can be represented as follows:

$$VOUT2 = \frac{-R4}{R3}(VOUT1 - VOS2) + VOS2 \tag{2}$$

Now, substituting equation (1) into equation (2), output signal VOUT2 becomes:

$$VOUT2 = \frac{-R4}{R3}\left(\frac{-R2}{R1}(VIN - VOS1) + VOS1 - VOS2\right) + VOS2 = \tag{3}$$
$$\frac{R4 \cdot R2}{R3 \cdot R1}VIN + \frac{-R4}{R3}\left(\left(\frac{R2}{R1} + 1\right)\right)VOS1 - VOS2\right) + VOS2$$

Equation (3) can also be expressed as a function of offset voltage VOS1 (where offset voltage VOS2 is about 0):

$$VOUT2 = \frac{R4 \cdot R2}{R3 \cdot R1}VIN + \frac{-R4}{R3}\left(\frac{R2}{R1} + 1\right)VOS1 \tag{4}$$

When resistor R1 is coupled to a block capacitor (AC coupled), the input signal VIN is equal to offset voltage VOS1, reducing equation (3) as follows:

$$VOUT2 = \frac{-R4}{R3}(VOS1 - VOS2) + VOS2 = \left(1 + \frac{R4}{R3}\right)VOS2 - \frac{R4}{R3}VOS1 \tag{5}$$

So, it can clearly be see from the DC coupled and AC coupled cases of equations (3) through (5), respectively, that noise and offset contributions in output voltage VOUT2 from offset voltage VOS1 can be significant. Thus, system 100 may require the use of trim circuit or better device matching to reduce the noise and offset contributions from offset voltage VOS1.

Some other conventional designs are: U.S. Pat. No. 3,899,743; U.S. Pat. No. 5,257,285; U.S. Pat. No. 6,642,783; U.S. Pat. No. 7,132,882; and U.S. Patent Pre-Grant Publ. No. 2006/0279344.

SUMMARY

A preferred embodiment of the present invention, accordingly, provides an apparatus. The apparatus comprises a first amplifier stage having an input terminal and an output terminal, wherein the first amplifier receives an input signal at its input terminal, and wherein the first amplifier stage includes a first offset voltage source that provide a first offset voltage to the first amplifier stage and that is coupled to a supply rail; and a second amplifier stage having an input terminal and an output terminal, wherein the input terminal of the second amplifier stage is coupled to the output terminal of the first amplifier stage, and wherein the second amplifier offset includes a second offset voltage source that provides a second offset voltage to the second amplifier stage, and wherein the second offset voltage source is coupled to the first amplifier stage so as to substantially reduce noise contribution from the first offset voltage.

In accordance with a preferred embodiment of the present invention, the first and second amplifiers stages further comprise a first inverting amplifier and a second inverting amplifier, respectively.

In accordance with a preferred embodiment of the present invention, the first inverting amplifier further comprises: an operational amplifier having a first input terminal, a second input terminal, and an output terminal, wherein the second offset voltage source is coupled to the first input terminal of the operational amplifier, and wherein the first voltage offset source is coupled to the second input terminal of the operational amplifier; and a resistor network coupled to the input terminal of the first inverting amplifier, the first input terminal of the operational amplifier, and the output terminal of the operational amplifier.

In accordance with a preferred embodiment of the present invention, the resistor network further comprises a plurality of resistors coupled in series with one another.

In accordance with a preferred embodiment of the present invention, the first input terminal of the operational amplifier is a negative input terminal, and wherein the second input terminal of the operational amplifier is a positive input terminal.

In accordance with a preferred embodiment of the present invention, the second inverting amplifier further comprises: an operational amplifier having a first input terminal, a second input terminal, and an output terminal, wherein the second voltage offset source is coupled to the second input terminal of the operational amplifier; and a resistor network coupled to the output terminal of the first inverting amplifier, the first input terminal of the operational amplifier, and the output terminal of the operational amplifier.

In accordance with a preferred embodiment of the present invention, the first input terminal of the operational amplifier is a negative input terminal, and wherein the second input terminal of the operational amplifier is a positive input terminal.

In accordance with a preferred embodiment of the present invention, an apparatus is provided. The apparatus comprises a first inverting amplifier having: a first resistor that receives an input signal; a first operational amplifier having a positive input terminal, an negative input terminal, and an output terminal, wherein the negative input terminal is coupled to the first resistor; a second resistor that is coupled between the output terminal of the first operational amplifier and the negative input terminal of the first operational amplifier; and a first offset voltage source that is coupled between the positive input terminal of the first operational amplifier and ground; and a second inverting amplifier having: a third resistor that is coupled to the output terminal of the first operational amplifier; a second operational amplifier having a negative input terminal, a positive input terminal, and an output terminal, wherein the negative input terminal of the second operational amplifier is coupled to the third resistor; a fourth resistor that is coupled between the output terminal of the second operational amplifier and the negative input terminal of second operational amplifier; and a second offset voltage source that is coupled between the positive input terminal of the second operational amplifier and the negative input terminal of the first operational amplifier.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
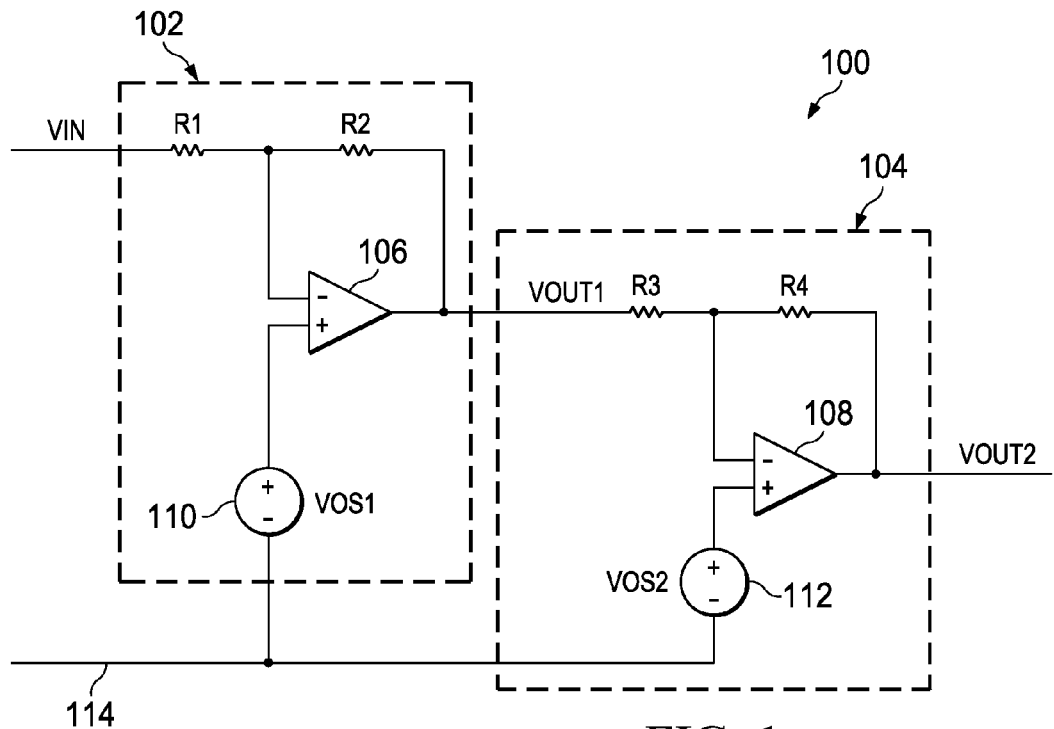
FIG. 1 is an example of a conventional multistage system.

Refer now to the drawings wherein depicted elements are, for the sake of clarity, not necessarily shown to scale and wherein like or similar elements are designated by the same reference numeral through the several views.

Figure 2:
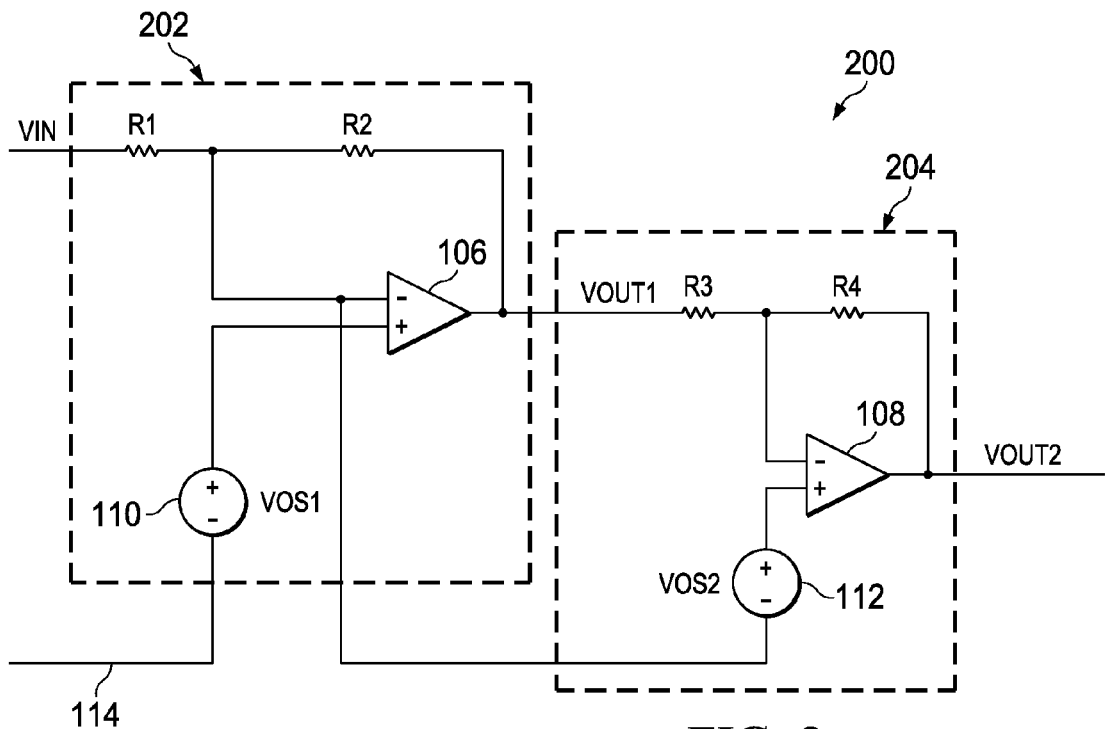
FIG. 2 is an example of a multistage system in accordance with a preferred embodiment of the present invention.

Turning to FIG. 2 of the drawings, a multistage system 200 in accordance with a preferred embodiment of the present invention can be seen. System 200 generally comprises amplifiers stages 202 and 204 (which are generally inverting amplifiers). When compared to system 100, system 200 has the same general components. One difference, however, is the coupled to voltage source 112 and the negative input terminal of operational amplifier 106 instead of supply rail 114. By making this change, the output voltage VOUT1 is represented as follows:

$$VOUT2 = \frac{-R4}{R3}(VOUT1 - (VOS1 + VOS2)) + (VOS1 + VOS2) \quad (6)$$

If equation (1) is substituted into equation (6), it becomes:

$$VOUT2 = \frac{-R4}{R3}\left(\frac{-R2}{R1}(VIN - VOS1) + VOS1 - (VOS1 + VOS2)\right) + \quad (7)$$
$$(VOS1 + VOS2) =$$
$$\frac{-R4}{R3}\left(\frac{-R2}{R1}(VIN - VOS1) - VOS2\right) + VOS1 + VOS2 =$$
$$\frac{R4 \cdot R2}{R3 \cdot R1}VIN + \frac{-R4}{R3}\left(\frac{R2}{R1}VOS1 - VOS2\right) + (VOS1 + VOS2)$$

Equation (7) can also be expressed as a function of offset voltage VOS1 (where offset voltage VOS2 is about 0):

$$VOUT2 = \frac{R4 \cdot R2}{R3 \cdot R1}VIN + \frac{-R4}{R3}\left(\frac{R2}{R1}VOS1\right) + VOS1 = \quad (8)$$
$$\frac{R4 \cdot R2}{R3 \cdot R1}VIN + \left(1 - \frac{R4 \cdot R2}{R3 \cdot R1}\right)VOS1$$

Additionally, when resistor R1 is coupled to a block capacitor (AC coupled), the input signal VIN is equal to offset voltage VOS1, reducing equation (7) as follows:

$$VOUT2 = \frac{R4}{R3}VOS2 + (VOS1 + VOS2) = \left(\frac{R4}{R3} + 1\right)VOS2 + VOS1 \quad (9)$$

As can clearly be seen by comparing equation (5) to equation (9) and equation (4) to equation (8), offset contributions from offset voltage VOS1 in output signal VOUT2 can be significantly reduced. Additionally, for noise contributions, the same analysis would apply to a noise analysis, leading a reduced noise in system 200 as compared to system 100.

As an example, these types of cascaded arrangements are typically used for single ended to differential conversion, where the differential output voltage $V_{OUTDiff}$ is:

$$V_{OUTDiff} = VOUT1 - VOUT2 \quad (10)$$

One can substitute equation (1) and (2) (for the conventional system 100) into equation (10) to arrive at the differential output voltage $V_{OUTDiff}$, which becomes:

$$V_{OUTDiff} = \quad (11)$$
$$VOUT1 - VOUT2 = VOU1 + \frac{R4}{R3}(VOUT1 - VOS2) - VOS2 =$$
$$\left(1 + \frac{R4}{R3}\right)VOUT1 - \left(1 + \frac{R4}{R3}\right)VOS2 =$$
$$\left(1 + \frac{R4}{R3}\right)\left(\frac{-R2}{R1}(VIN - VOS1) + VOS1\right) - \left(1 + \frac{R4}{R3}\right)VOS2 =$$
$$\frac{-R2}{R1}\left(1 + \frac{R4}{R3}\right)VIN + \frac{R2}{R1}\left(1 + \frac{R4}{R3}\right)VOS1 +$$

-continued $$\left(1+\frac{R4}{R3}\right)VOS1 - \left(1+\frac{R4}{R3}\right)VOS2 =$$
$$\frac{-R2}{R1}\left(1+\frac{R4}{R3}\right)VIN + \left(1+\frac{R2}{R3}\right)VOS1 - \left(1+\frac{R4}{R3}\right)VOS2$$

Alternatively, one can substitute equation (1) and (6) (for the system 200) into equation (10) to arrive at the differential output voltage $V_{OUTDiff}$, which becomes:

$$V_{OUTDiff} = VOUT1 - VOUT2 =$$
$$VOUT1 + \frac{R4}{R3}(VOUT1 - (VOS1 + VOS2)) - (VOS1 + VOS2) =$$
$$\left(1+\frac{R4}{R3}\right)VOUT1 - \left(1+\frac{R4}{R3}\right)(VOS1+VOS2) =$$
$$\left(1+\frac{R4}{R3}\right)\left(\frac{-R2}{R1}(VIN - VOS1) + VOS1\right) -$$
$$\left(1+\frac{R4}{R3}\right)(VOS1+VOS2) = \frac{-R2}{R1}\left(1+\frac{R4}{R3}\right)VIN +$$
$$\left(1+\frac{R4}{R3}\right)\left(1+\frac{R2}{R1}\right)VOS1 - \left(1+\frac{R4}{R3}\right)(VOS1+VOS2) =$$
$$\frac{-R2}{R1}\left(1+\frac{R4}{R3}\right)VIN + \frac{R2}{R1}\left(1+\frac{R4}{R3}\right)VOS1 +$$
$$\left(1+\frac{R4}{R3}\right)VOS1 - \left(1+\frac{R4}{R3}\right)VOS1 - \left(1+\frac{R4}{R3}\right)VOS2 =$$
$$\frac{-R2}{R1}\left(1+\frac{R4}{R3}\right)VIN + \frac{R2}{R1}\left(1+\frac{R4}{R3}\right)VOS1 - \left(1+\frac{R4}{R3}\right)VOS2$$

Comparing equations (11) and (12), the input signal VIN and offset voltage VOS2 contributions are clearly the same for both, whereas the offset voltage VOS1 contribution is significantly reduced. Additionally, because (in a differential to single ended conversion) the ratio of resistors R4/R3 is generally 1. Equations (11) and (12) can be rewritten as follows (where the input signal VIN and offset voltage VOS2 contributions have been dropped):

$$V_{OUTDiff} = \left(2 + 2 \cdot \frac{R2}{R1}\right)VOS1 \quad (13)$$

$$V_{OUTDiff} = 2 \cdot \frac{R2}{R1}VOS1 \quad (14)$$

Clearly, system 200 has superior performance over system 100.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
  a first amplifier stage having:
    an operational amplifier with a first input terminal, a second input terminal, and an output terminal, wherein the first input terminal of the operational amplifier receives an input signal; and
    a first offset voltage source that is coupled to the second input terminal of the operational amplifier so as to provide a first offset voltage to the first amplifier stage and that is coupled to a supply rail; and
  a second amplifier stage having an input terminal and an output terminal, wherein the input terminal of the second amplifier stage is coupled to the output terminal of the operational amplifier, and wherein the second amplifier offset includes a second offset voltage source that provides a second offset voltage to the second amplifier stage, and wherein the second offset voltage source is coupled to the first input terminal of the operational amplifier so as to substantially reduce noise contribution from the first offset voltage.

2. The apparatus of claim 1, wherein the first and second amplifiers stages further comprise a first inverting amplifier and a second inverting amplifier, respectively.

3. The apparatus of claim 2, wherein the first inverting amplifier further comprises a resistor network coupled to the first input terminal of the operational amplifier and the output terminal of the operational amplifier.

4. The apparatus of claim 3, wherein the resistor network further comprises a plurality of resistors coupled in series with one another.

5. The apparatus of claim 4, wherein the first input terminal of the operational amplifier is a negative input terminal, and wherein the second input terminal of the operational amplifier is a positive input terminal.

6. The apparatus of claim 2, wherein the operational amplifier further comprises a first operational amplifier, and wherein the second inverting amplifier further comprises:
  an operational amplifier having a first input terminal, a second input terminal, and an output terminal, wherein the second voltage offset source is coupled to the second input terminal of the second operational amplifier; and
  a resistor network coupled to the output terminal of the first operational amplifier, the first input terminal of the second operational amplifier, and the output terminal of the operational amplifier.

7. The apparatus of claim 6, wherein the resistor network further comprises a plurality of resistors coupled in series with one another.

8. The apparatus of claim 7, wherein the first input terminal of the operational amplifier is a negative input terminal, and wherein the second input terminal of the operational amplifier is a positive input terminal.

9. An apparatus comprising:
  a first inverting amplifier having:
    a first resistor that receives an input signal;
    a first operational amplifier having a positive input terminal, an negative input terminal, and an output terminal, wherein the negative input terminal is coupled to the first resistor;
    a second resistor that is coupled between the output terminal of the first operational amplifier and the negative input terminal of the first operational amplifier; and
    a first offset voltage source that is coupled between the positive input terminal of the first operational amplifier and ground; and
  a second inverting amplifier having:
    a third resistor that is coupled to the output terminal of the first operational amplifier;
    a second operational amplifier having a negative input terminal, a positive input terminal, and an output terminal, wherein the negative input terminal of the second operational amplifier is coupled to the third resistor;
a fourth resistor that is coupled between the output terminal of the second operational amplifier and the negative input terminal of second operational amplifier; and a second offset voltage source that is coupled between the positive input terminal of the second operational amplifier and the negative input terminal of the first operational amplifier.

* * * * *